QUANTUM MECHANICAL TUNNELING SEMICONDUCTOR DEVICE

Filed June 23, 1961

INVENTORS
JOHN C. MARINACE
RICHARD F. RUTZ
BY Roy R. Schlemmer, Jr.
ATTORNEY 3,215,908
Patented Nov. 2, 1965

3,215,908

QUANTUM MECHANICAL TUNNELING SEMICONDUCTOR DEVICE

John C. Marinace, Yorktown Heights, and Richard F. Rutz, Fishkill, N.Y., assignors to International Business Machines Corporation, New York, N.Y., a corporation of New York Filed June 23, 1961, Ser. No. 119,127
7 Claims. (Cl. 317—235)

The present invention relates to a novel quantum mechanical tunneling semiconductor device and to a method for producing same. More particularly, it relates to such a device wherein the tunneling characteristic becomes highly resistive over a significantly large voltage range just before switching to the classical diffusion characteristic.

The phenomenon of quantum mechanical tunneling in p-n junctions in semiconductor materials is well known in the art and has been described by Dr. Leo Esaki in the Physical Review, volume 109, January 1958, pages 603 and 604 and a two terminal device employing this phenomenon has come to be known as the "Esaki" or tunnel diode.

Briefly, a quantum mechanical tunneling device may be described as one having a short circuit stable negative resistance region in its current voltage characteristic at low voltages and which is relatively insensitive to both temperature and radiation effects. Semiconductor devices involving the phenomenon of quantum mechanical tunneling require certain physical criteria in their structure that are different from conventional semiconductor p-n junctions. These criteria are that the semiconductor material on each side of the junction be extremely heavily doped and that the width of the junction, that is, the space-charge layer at the junction between the highly doped region of one conductivity type and the highly doped region of the opposite conductivity type have a maximum thickness of about 150 A° at zero bias. The doping levels on each side of the junction must be degenerate, that is the Fermi level must lie within the valence band on the "p" side of the junction and within the conduction band on the other side.

Quantum mechanical tunneling devices have exhibited a wide range of performance characteristics depending upon the semiconductor materials from which they had been made and the impurities therein. However, in the past all such devices known in the art have exhibited generally the current-voltage characteristic having a first positive resistance region followed by a negative resistance region which is followed by a third positive resistance region. Such an E–I output characteristic of a typical prior art Esaki diode is indicated by the discontinuous curve in FIG. 1. Such typical output characteristics include a low voltage node or "peak" between the first and second regions and a valley or null between the second and third regions. It is possible to move this characteristic about the origin and also vary the peak to valley current ratios by using different semiconductor materials having different resistivities; however, the basic shape of the characteristic curve has been approximately the same as well as the horizontal or voltage spacing between the peak and valley. While it has been thought that the tunneling phenomenon could be utilized to produce unusual device characteristics, production problems such as control of doping levels, etc. have prevented maximum utilization of the phenomenon. For example, it has not been possible to obtain tunneling characteristics by using conventional alloying techniques and conventional donor doping in the alloying materials or substrates of germanium heavily doped with acceptors ($>10^{20}$).

What has been discovered is a method of obtaining tunneling devices by alloying junctions into germanium reavily doped with acceptors. It has further been found that when such a doping level is employed on the "p" type conductivity side of a quantum mechanical tunneling junction together with a higher than normal donor doping level in the alloy dot material, an unusual output characteristic curve is obtained.

It is accordingly the primary object of this invention to provide a novel quantum mechanical tunneling device having a radically different current-voltage characteristic.

It is a further object to provide a method for producing such a tunneling device.

It is a further object to provide such a device wherein the tunneling current becomes essentially independent of voltage over an abnormally wide voltage range just before switching to the classical diffusion current.

It is a still further object to provide an improved quantum mechanical tunneling diode having highly reproducible peak to valley current ratios.

The foregoing and other objects, features and advantages of the invention will be apparent from the following more particular description of a preferred embodiment of the invention, as illustrated in the accompanying drawings.

The objects of the invention are accomplished in general by a solid state quantum mechanical tunneling semiconductor p-n junction having approximately 100 times greater than minimum degeneracy doping on the "p" side of the junction and having at least about five times the minimum degeneracy doping on the "n" side of the junction. Satisfactory levels of doping have been obtained by using the alloy dot fabricating technique as will be more fully described subsequently.

For purposes of clarity the term "quantum mechanical tunneling semiconductor junction" will simply be referred to hereinafter as a "tunneling junction." The term "normal degenerate doping" is intended to refer to doping levels that are believed to be between 5 and $8\times10^{18}$ atoms of conductivity type impurity/cc. crystalline semiconductor material for germanium. For other semiconductors with different band gaps the figure must be appropriately adjusted. Present quantum mechanical tunneling diodes known in the art require normal degenerate doping levels on both sides of the p-n junction while the tunneling junction of the present invention requires very heavy doping on the "p" side of the junction and heavier than normal doping on the "n" side as will be more specifically explained subsequently.

Figure 1:
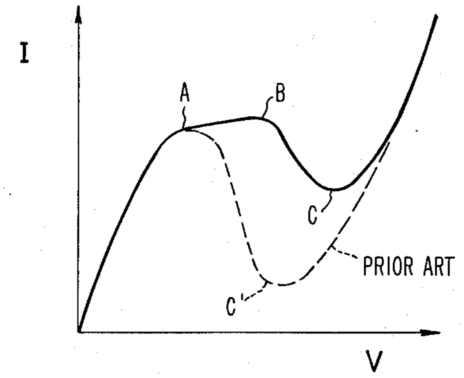
FIG. 1 is a graphical representation of the output characteristic of a quantum mechanical tunneling semiconductor device constructed in accordance with the present invention.

The invention will now be more particularly pointed out and described with reference to the drawings. FIG. 1 shows the output characteristic of a quantum mechanical tunneling semiconductor device according to the present invention in the solid portion thereof and the output characteristic of a conventional tunneling semiconductor junction is shown in the discontinuous portion marked "Prior Art." A tunneling junction constructed in accordance with the present invention has an unusual flattened our area or plateau from A to B just subsequent to the normal turning point A. It will be noted that the conventional tunneling diode has no such level or substantially level portion in its output characteristic but immediately starts sloping downwardly through its negative resistance portion to its second turning point C′. Referring to the discontinuous or normal Esaki diode characteristic, the first turn-over point A is known in the art as the "peak" value of the current and is governed by the distance of the band edges from the Fermi level. As a "forward" voltage is applied, the Fermi level bends at the junction and the band edges approach each other. After the band edges are approximately level further increase of voltage reduces the effect of the tunneling and reduces the current as the voltage increases until the second turn-over point "C" is reached. At this point, the voltage has reached a value sufficient to permit electrons to diffuse from the conduction band of the "n" region to the conduction band of the "p" region and holes to diffuse from the valence band of the "p" region to the valence band of the "n" region. Also, in addition a compound of current exists known widely in the literature as excess current. This turn-over point is known in the art as the "valley" and after this turn-over point, further increases in voltage result in increases in current as in the forward direction of an ordinary diode.

According to the present invention this turning point A is followed by the plateau portion A–B. This area is believed to be due to the extremely heavily doped "p" region whereby the greater distance of the Fermi level from the band edge makes the band edge itself not sharp but diffuse. Thus, the tunneling states available fall off gradually rather than abruptly as the voltage is increased. Once the point B has been reached, the instant tunneling junction behaves like a normal quantum mechanical tunneling diode having a negative resistance region B–C and a second turning point at C. It will be noted that the distance B–C of the instant device is approximately equal to the distance A–C′ of the conventional Esaki diode. It may therefore be seen that the increased distance between the actual turning points A and C for the instant tunneling junction is greater than that for the normal Esaki diode by an amount approximately equal to the level portion A–B.

It has also been found that the peak to valley current ratios obtained with devices made in accordance with the present invention are more nearly reproducible than with conventional tunneling devices. This of course has the advantage of circuit uniformity and increased "acceptable" yields from the device production line.

The tunneling diodes of the present invention have utility as low voltage current regulators wherein the diode is operated in the plateau or level region A–B of its output characteristic and in various switching applications currently being practiced by those skilled in the art.

Figure 2:
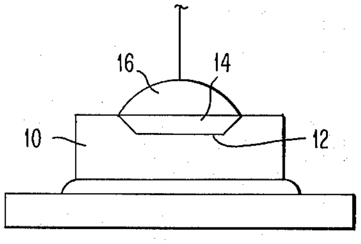
FIG. 2 is a schematic representation of such a quantum mechanical tunneling semiconductor device.

Referring to FIG. 2, a schematic cross-sectional sketch is shown of a quantum mechanical tunneling type alloy junction made in accordance with the invention. The junction is made up of a bulk region 10 of germanium containing a "p" conductivity type determining impurity, for example, gallium in a concentration such that the semiconductor material is highly degenerate. Doping levels believed to be approximately $8\times10^{20}$ atoms of Ga/cc. of Ge as measured by a 4-point resistivity probe were used in this embodiment. The semiconductor device of FIG. 2 has an abrupt p-n junction 12 between a recrystallized region 14 of "n" conductivity type germanium and the "p" conductivity type germanium body 10. The recrystallized region 14 is formed as a result of alloying a quantity of arsenic and carrier metal such as tin 16 into the gallium doped germanium body 10. It has been found that in alloying into gallium doped germanium with a germanium dot heavily doped with arsenic, a sufficient quantity of the arsenic from the region 16 is included in the recrystallized region 14 and operates to impart "n" conductivity type to the recrystallized region 14 in a concentration sufficiently high that degenerate semiconductor material is produced, i.e. the barrier layer is sufficiently narrow for good tunneling probability which for the material germanium is less than 150 A° in width.

Another form of tunneling p-n junction having the same characteristics has been fabricated wherein the very heavily doped "p" conductivity type region has been alloyed into an "n" conductivity type body member 10. In this example an aluminum (Al) or aluminum:boron (Al:B) dot was alloyed into a germanium body member heavily doped with arsenic, i.e., approximately $3\times10^{19}$ atoms of As/cc. of Ge. The recrystallized "p" region 14 was found to be exceedingly heavily doped, i.e., approximately $8\times10^{20}$ atoms of Al/cc. of Ge and the junction 12 therebetween was sufficiently narrow (<150 A°) to permit tunneling.

Figure 3:
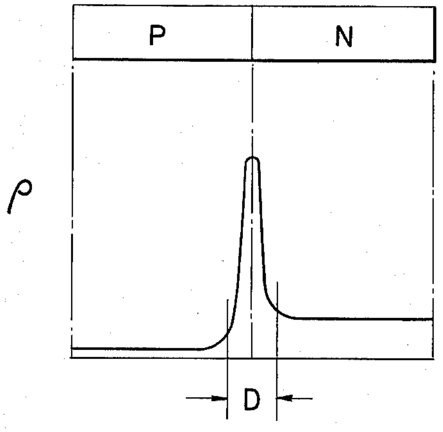
FIG. 3 is a plot of resistivity versus distance from such a quantum mechanical junction dimensionally correlated with FIG. 4.

Referring next to FIG. 3, a dimensionally correlated resistivity plot of the device of FIG. 2 is shown wherein resistivity is plotted as the ordinate and distance perpendicular to the junction 12 of FIG. 2 is plotted as the abscissa. The resistivity perpendicular to the junction 12 varies from a constant value exceeding degeneracy in the region 14 through intrinsic at the junction 12 and back to a constant value far exceeding degeneracy in the region 10. The resistivity value for "p" gallium-doped degenerate germanium region is approximately 0.0006 ohm cm. and is produced by the introduction of conductivity type determining impurities into the material in a concentration on the order of $8\times10^{20}$ atoms per cc., as is illustrated in FIG. 3. The resistivity value for the "n" degenerate arsenic doped germanium region is approximately 0.001 ohm cm. and is produced by an impurity concentration of approximately $3\times10^{19}$ atoms per cc.

Figure 4:
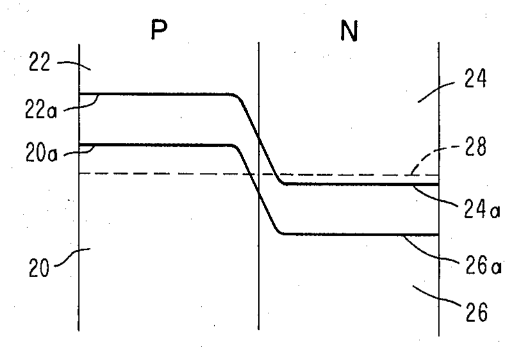
FIG. 4 is an energy level diagram across such a junction dimensionally correlated with FIG. 3.

Referring next to FIG. 4, an energy level diagram is provided wherein the "p" conductivity type region has a valence band 20 with an upper edge 20*a* and a conduction band 22 having a lower edge 22*a*. Similarly, the "n" conductivity type region is equipped with a conduction band 24 having a lower edge 24*a* and a valence band 26 having an upper edge 26*a*. The effects of the degenerate doping of the semiconductor materials are such as to cause the valence band edge 20*a* of the "p" conductivity type material to overlap the conduction band edge 24*a* of the "n" conductivity type material so that the Fermi level 28 passes from the valence band of the one conductivity type material to the conduction band of the other and the transition region is within the width D as shown dimensionally correlated with FIG. 3 so that an electron can tunnel directly from the conduction band of the "n" type semiconductor material to the valence band of the "p" conductivity type semiconductor material, provided there be a "hole" there of the same energy or of a lower energy such that the difference in energy can be imparted to a phonon of "allowed" energy. Also, electrons can tunnel from the valence band of the p-region to the conduction band of the n-region under similar circumstances.

The energy level diagram of the present tunneling junction differs from a conventional Esaki diode junction in that the valence band edge 20*a* of the p-region 22 is diffuse and considerably farther from the Fermi level 28 than is the conduction band edge 24*a* of the n-region.

In order to aid one skilled in the art in practicing the invention and to provide a starting place for one skilled in the art in a complicated technology, the following specific values of a workable embodiment are provided. However, it should be noted that in the light of the above description many such sets of specific values may be provided so that no limitation should be construed by these values.

Referring again to FIG. 2, a body of germanium containing gallium in a concentration of approximately 2—$8\times10^{20}$ atoms per cc. prepared by drawing from a gallium solution of geramnium is brought into contact with a body containing tin and 3 to 5% arsenic, and heated to approximately 500° C. for five seconds in order to form an alloy connection involving region 14 and junction 12 of FIG. 2. The output characteristic of the resulting semiconductor structure has a level or plateau region A–B, as illustrated in FIG. 1, as compared with a narrow peak region for a similar device made in accordance with prior art teachings.

What has been described is a novel quantum mechanical tunneling semiconductor diode structure having a novel output characteristic and a method for fabricating such a junction.

While the present state of the art is such that arsenic concentrations of greater than $5\times10^{19}/cm.^3$ in germanium are difficult to attain, it is to be expected that $n^{++}-p^{+}$ or $n^{++}-p^{++}$ junctions would exhibit a similar characteristic.

Moreover, in semiconductors other than germanium in which the band edges can be made diffuse and positioned a considerable distance from the Fermi level, similar characteristics can be expected.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A solid state quantum mechanical tunneling semiconductor device having a substantially voltage independent region between a first positive resistance region and a second negative resistance region of its E–I output characteristic comprising a monocrystalline germanium body member having a p-n junction therein wherein the doping level of at least one of the conductivity type determining impurities is between about 2 and $8\times10^{20}$ atoms per cc. of germanium and wherein the doping level of the other conductivity type determining impurity is at least $2\times10^{19}$ atoms per cc. of germanium.

2. A semiconductor tunneling device as set forth in claim 1 wherein the "p" conductivity type determining impurity is present in a concentration of between about 2 and $8\times10^{20}$ atoms per cc. of germanium.

3. A semiconductor tunneling device as set forth in claim 1 wherein the "n" conductivity type determining impurity is present in a concentration of between about 2 and $8\times10^{20}$ atoms per cc. of germanium.

4. A semiconductor tunneling device as set forth in claim 3 wherein the "n" conductivity type determining impurity is arsenic and the "p" conductivity type determining impurity is gallium.

5. A solid state quantum mechanical tunneling semiconductor device comprising a germanium body member gallium doped to approximately $8\times10^{20}$ atoms per cc. of germanium and having an alloy dot of germanium containing at least 3% by weight of arsenic therein wherein a recrystallized region is formed in the germanium gallium body member having a concentration of arsenic in said recrystallized portion of at least $2\times10^{19}$ atoms of arsenic per cc. of germanium and wherein the barrier region between the recrystallized portion and the germanium gallium body is less than 150 A° in width under a condition of zero bias.

6. A solid state quantum mechanical tunneling semiconductor device comprising a germanium body containing at least $1\times10^{19}$ atoms of arsenic per cc. of germanium and having an alloy dot on the surface thereof, said dot being composed of substantially pure aluminum and forming in the germanium arsenic body member a recrystallized region containing between about 2 and $8\times10^{20}$ atoms of aluminum per cc. of germanium and forming a barrier layer between said recrystallized portion and the germanium arsenic body member less than 150 A° in width under a condition of zero bias.

7. A solid state quantum mechanical tunneling device comprising a Ge body containing at least $2\times10^{19}$ arsenic atoms per cc. of Ge, having a recrystallized layer therein grown from a solution containing at least 1% gallium to form a recrystallized "p" conductivity region having a concentration of between about 2 and $8\times10^{20}$ atoms of gallium per cc. of germanium and appropriate contacts resistance connected to each of said regions.

References Cited by the Examiner

UNITED STATES PATENTS 3,018,423 1/62 Aarons et al. __________ 317—234
3,033,714 5/62 Esaki et al. ____________ 148—33

DAVID J. GALVIN, *Primary Examiner.*

JAMES D. KALLAM, *Examiner.*